(12) United States Patent
McDonnell et al.

(10) Patent No.: US 6,445,294 B1
(45) Date of Patent: Sep. 3, 2002

(54) PROXIMITY SENSOR

(75) Inventors: Judson G. McDonnell, Farmington Hills; James G. Stanley, Novi, both of MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 09/616,406

(22) Filed: Jul. 14, 2000

Related U.S. Application Data
(60) Provisional application No. 60/144,161, filed on Jul. 15, 1999.

(51) Int. Cl.$^7$ .............................................. G08B 13/26
(52) U.S. Cl. ...................... 340/562; 180/272; 280/735; 340/561
(58) Field of Search ................................ 340/562, 561, 340/573.1, 686.6; 180/272; 280/735; 307/10.1; 701/45; 324/688

(56) References Cited

U.S. PATENT DOCUMENTS

| | | | |
|---|---|---|---|
| 3,111,608 A | 11/1963 | Boenning et al. | 361/179 |
| 3,177,481 A | 4/1965 | Joy et al. | 246/167 R |
| 3,237,105 A | 2/1966 | Kalmus | 340/562 |
| 3,324,848 A | 6/1967 | Domeier et al. | 600/535 |
| 3,439,358 A | 4/1969 | Salmons | 340/552 |
| 3,740,567 A | 6/1973 | Atkins | 340/573.1 |
| 3,898,472 A | 8/1975 | Long | 180/270 |
| 3,943,376 A | 3/1976 | Long | 307/116 |
| 4,300,116 A | 11/1981 | Stahovec | 340/904 |
| 4,430,645 A | 2/1984 | Eskandry et al. | 340/572.2 |
| 4,586,260 A | 5/1986 | Baxter et al. | 33/706 |
| 4,766,368 A | 8/1988 | Cox | 324/688 |
| 4,796,013 A | 1/1989 | Yasuda et al. | 340/562 |
| 4,831,279 A | 5/1989 | Ingraham | 307/116 |
| 4,853,617 A | 8/1989 | Douglas et al. | 324/67 |
| 4,887,024 A | 12/1989 | Sugiyama et al. | 324/674 |
| 4,980,519 A | 12/1990 | Mathews | 178/19 |
| 5,166,679 A | 11/1992 | Vranish et al. | 340 |

(List continued on next page.)
/870.37

OTHER PUBLICATIONS

Fink, Donald G. and Beaty, H. W.; Standard Handbook for Electrical Engineers 12th ed., McGraw–Hill Book Co, 1987, pp. 3–57 through 3–65.

Smith, J.R.; "Field Mice: Extracting hand geometry from electric field measurements", IBM Systems Journal, vol. 35, Nos. 3&4, pp. 587–608, 1996.

Reference Data for Engineers: Radio, Electronics, Computer, and Communications 7th edition, Fong et al., "Impedance Bridges", pp. 12–3 through 12–12, 1985.

Jinno K.; Ofuji, M.; Saito, T.; Sekido, S.; "Occupant Sensing Utilizing Perturbation of Electric Fields", SAE 971051, Reprinted from: Anthropomorphic Dummies and Crash Instrumentation Sensors (SP–1261), SAE International Congress & Exposition, Detroit, MI Feb. 24–27, pp. 117–129, 1997.

*Primary Examiner*—Thomas Mullen
(74) *Attorney, Agent, or Firm*—Dinnin & Dunn, P.C.

(57) ABSTRACT

A sense electrode (12) is driven by a first oscillatory signal (26) and at least one control electrode (14) is driven by a second oscillatory signal (30). In first (38) and second (40) states (36), the second oscillatory signal (30) respectively has a first and second phase with respect to the first oscillatory signal (26). The proximity of an electric-field-influencing media (20) to the proximity sensor (10) is responsive to the difference of third (50) and fourth (52) signals that are respectively measured when the second oscillatory signal (30) is in respective first (38) and second (40) states. The proximity sensor (10) is calibrated with a known capacitance operatively coupled to the sense electrode (12) with a plurality of switches (S1, S2) adapted so that the switches (S1, S2) have a relatively small effect on the capacitance of the sense electrode (12).

29 Claims, 10 Drawing Sheets

U.S. PATENT DOCUMENTS

| | | | |
|---|---|---|---|
| 5,214,388 A | 5/1993 | Vranish et al. | 324/683 |
| 5,247,281 A | 9/1993 | Facon et al. | 340/562 |
| 5,363,051 A | 11/1994 | Jenstrom et al. | 324/661 |
| 5,373,245 A | 12/1994 | Vranish | 324/662 |
| 5,442,347 A | 8/1995 | Vranish | 340/870.37 |
| 5,446,391 A | 8/1995 | Aoki et al. | 324/661 |
| 5,525,843 A | 6/1996 | Howing | 307/9.1 |
| 5,539,292 A | 7/1996 | Vranish | 318/568.21 |
| 5,602,734 A | 2/1997 | Kithil | 364/424.055 |
| 5,654,643 A | 8/1997 | Bechtel et al. | 324/687 |
| 5,691,693 A | 11/1997 | Kithil | 340/439 |
| 5,722,686 A | 3/1998 | Blackburn et al. | 280/735 |
| 5,724,024 A | 3/1998 | Sonderegger et al. | 340/562 |
| 5,726,581 A | 3/1998 | Vranish | 324/688 |
| 5,770,997 A | 6/1998 | Kleinberg et al. | 280/235 |
| 5,793,176 A | 8/1998 | Novak | 318/587 |
| 5,802,479 A | 9/1998 | Kithill et al. | 701/45 |
| 5,844,415 A | 12/1998 | Gershenfeld et al. | 324/663 |
| 5,844,486 A | 12/1998 | Kithil et al. | 340/573 |
| 5,871,232 A | 2/1999 | White | 280/735 |
| 5,914,610 A | 6/1999 | Gershenfeld et al. | 324/663 |
| 5,948,031 A | 9/1999 | Jinno et al. | 701/45 |
| 5,964,478 A | 10/1999 | Stanley et al. | 280/735 |
| 6,014,602 A | 1/2000 | Kithil et al. | 701/45 |
| 6,031,380 A | 2/2000 | Gleixner et al. | 324/683 |
| 6,043,743 A | 3/2000 | Saito et al. | 340/562 |
| 6,079,738 A | 6/2000 | Lotito et al. | 280/735 |
| 6,094,610 A | 7/2000 | Steffens, Jr. et al. | 701/45 |
| 6,348,862 B1 * | 2/2002 | McDonnell et al. | 340/562 |

* cited by examiner

PROXIMITY SENSOR

CROSS-REFERENCE TO RELATED APPLICATIONS

The instant application claims the benefit of prior U.S. Provisional Application Ser. No. 60/144,161 filed on Jul. 15, 1999.

Commonly owned U.S. application Ser. No. 09/520,866 entitled Proximity Sensor, filed on Mar. 6, 2000 ("ASL-225-US") now U.S. Pat. No. 6,348,862, also discloses a proximity sensor.

The above-identified applications are incorporated herein by reference.

BRIEF DESCRIPTION OF THE DRAWINGS

In the accompanying drawings:

FIG. 1b illustrates various control states of the proximity sensor of FIG. 1a;

FIG. 6 is a comparison of the capacitance of a proximity sensor as a function of target distance for various modes of operation;

DESCRIPTION OF EMBODIMENT(S)

Figure 1A:
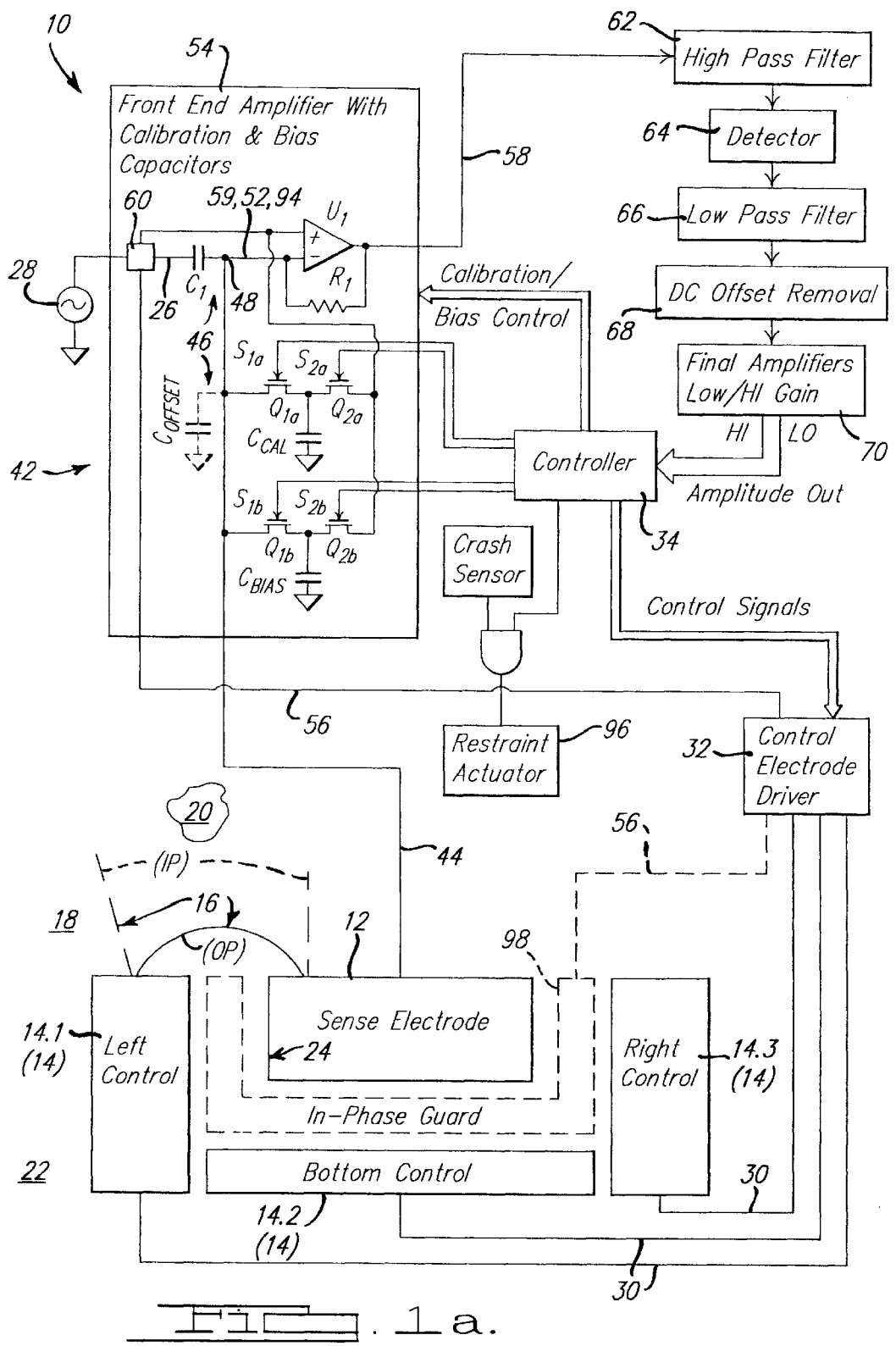
FIG. 1a illustrates a proximity sensor having three control electrodes, and a block diagram of an associated circuit.

Referring to FIG. 1a, a proximity sensor 10 comprises a conductive sense electrode 12—a first electrode—and at least one conductive control electrode 14—at least one second electrode—for example a plurality of control electrodes 14.1, 14.2 and 14.3, separated from the sense electrode 12, so that an electric field 16 created by the sense electrode 12 and at least one of the control electrodes 14.1, 14.2 and 14.3 occupies a region of space 18 within which a proximity of an electric field influencing media 20 is sensed. The sense 12 and control electrodes 14.1, 14.2 and 14.3 are, for example, disposed on a common surface 22, wherein the control electrodes 14.1, 14.2 and 14.3 are disposed outside a periphery 24 of the sense electrode 12, are separated from one another, and at least partially surround the sense electrode 12.

Figure 1B:
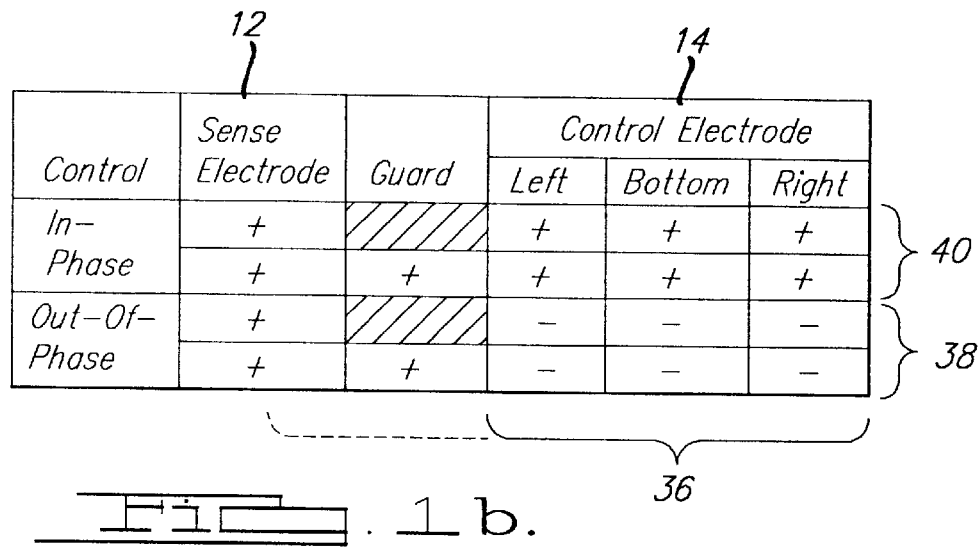

A first oscillatory signal 26 is applied to the sense electrode 12 by a signal generator 28. A second oscillatory signal 30 is applied by a control electrode driver 32 to the control electrodes 14.1, 14.2 and 14.3, whereby a phase of the second oscillatory signal 30 relative to the first oscillatory signal 26 is controlled by a controller 34. Referring to FIG. 1b, wherein the "+" and "−" signs indicate signals that are respectively in -phase and out-of-phase with respect to the first oscillatory signal 26—the second oscillatory signal 30 comprises a state 36 corresponding to the phase of the second oscillatory signal 30 relative to the first oscillatory signal 26, and the controller 34 controls this state. When in a first state 38 the second oscillatory signal 30 has a first phase relative to the first oscillatory signal 26, when in a second state 40 the second oscillatory signal 30 has a second phase relative to the first oscillatory signal 26. For example, with a sinusoidal first oscillatory signal 26, in the first state 38, the first phase is substantially one hundred eighty (180) degrees so that the second oscillatory signal 30 is substantially out-of-phase with the first oscillatory signal 26, and in the second state 40, the second phase is substantially zero (0) degrees so that the second oscillatory signal 30 is substantially in-phase with the first oscillatory signal 26.

A first circuit 42 operatively coupled to the sense electrode 12 senses a response signal 44 from the sense electrode 12. The response signal 44 is responsive to the first 26 and second 30 oscillatory signals, and to a proximity of an electric-field-influencing media 20 to the sense electrode 12. The response signal 44 is, for example, a current from the sense electrode 12 responsive to applied voltages of the first 26 and second 30 oscillatory signals, or a voltage responsive to the current. Generally, the response signal 44 either is used to determine the capacitance of the sense electrode 12, or the response signal 44 is a measure of the capacitance of the sense electrode 12.

For example, in the first circuit 42 illustrated in FIG. 1a, the first oscillatory signal 26 comprises a voltage applied to a voltage divider 46 comprising a capacitor C1 and the as electrode 12 wherein one terminal of the capacitor C1 is operatively coupled to the first electrode 12 at a first node 48 and another terminal of the capacitor C1 is operatively coupled to the first oscillatory signal 26, wherein a displacement current flows through capacitor C1 and the first electrode 12. The resulting voltage drop across the first electrode 12 at the first node 48 is sensed as the response signal 44. More particularly, when the second oscillatory signal 30 is in the first state 38, a third signal 50 is sensed at the fist node 48 responsive to an out-of-phase signal applied to the control electrodes 14.1, 14.2 and 14.3 and when the second oscillatory signal 30 is in the second state 40, a fourth signal 52 is sensed at the first node 48 responsive to an in-phase signal applied to the control electrodes 14.1, 14.2 and 14.3.

In the exemplary system illustrated in FIG. 1a the signal generator 28 generates a continuous wave sinusoidal signal having a frequency of 100 KHz. The signal generator is operatively coupled to a front end amplifier 54 comprising the voltage divider 46 and a buffer amplifier U1. A buffered first oscillatory signal 56—a "buffered" version of the first oscillatory signal 26—is operatively coupled to the control electrode driver 32, which generates the second oscillatory signal 30 that is either in-phase or out-of-phase with respect to the first oscillatory signal 26, under digital control of the controller 34. The output 58 of the front end amplifier 54—at the same frequency as the signal generator 28—increases in amplitude as the capacitance of the sense electrode 12, or that of an associated parasitic capacitance, increases. Accordingly, the output 58 of the front end amplifier 54 provides a measure of the capacitance that is operatively coupled to the first node 48. Furthermore, when the second oscillatory signal 30 is in the first state 38 so that the control electrodes 14.1, 14.2 and 14.3 are driven out-of-phase (OP) with respect to the sense electrode 12, the associated third signal 50 at the output 58 provides a measure of out-of-phase capacitance $C_{OP}$ of the sense electrode 12. Moreover, when the second oscillatory signal 30 is in the second state 40 so that the control electrodes 14.1, 14.2 and 14.3 are driven in-phase (IP) with respect to the sense electrode 12, the associated fourth signal 52 at the output 58 provides a measure of in-phase capacitance $C_{IP}$ of the sense electrode 12. The front end amplifier 54 incorporates a second circuit 60—described more fully hereinbelow—that partially cancels the associated offset capacitance $C_{OFFSET}$ so as to enable a higher gain in the front end amplifier 54, without saturation which could otherwise result without this cancellation.

The front end amplifier 54 also incorporates a calibration capacitor $C_{CAL}$ that can be operatively coupled in parallel with the sense electrode 12 by activating FET transistor Q1$a$ and deactivating FET transistor Q2$a$ for purposes of calibrating the first circuit 42, for example to compensate for drift of component values over time or due to temperature variation. The calibration capacitor $C_{CAL}$ can be decoupled from the sense electrode 12 by deactivating FET transistor Q1$a$ and activating FET transistor Q2$a$. As will be described more fully hereinbelow, this arrangement provides a means for coupling and decoupling a capacitor to the sense electrode 12 without introducing associated parasitic capacitances of the associated switch elements to the first node 48. The associated states of the FET transistors Q1$a$ and Q2$a$ are mutually exclusive, under digital control, for example by the controller 34.

Similarly, the front end amplifier 54 also incorporates a bias capacitor $C_{BIAS}$ that can be operatively coupled in parallel with the sense electrode 12 by activating FET transistor Q1$b$ and deactivating FET transistor Q2$b$ for purposes of augmenting the in-phase capacitance $C_{IP}$ so that the associated third signal 50 is of similar magnitude to the fourth signal 52. This is useful, because as will be described more fully hereinbelow, the out-of-phase capacitance $C_{OP}$ is generally of greater magnitude than the in-phase capacitance $C_{IP}$, so by making the net capacitance at the first node 48 similar in both cases, both measurements can be made with the same amplifier gain so as to maximize dynamic range. The bias capacitor $C_{BIAS}$ can be decoupled from the sense electrode 12 by deactivating FET transistor Q1$b$ and activating FET transistor Q2$b$.

A high pass filter 62 operatively coupled to the output 58 of the front end amplifier 54 filters out base band signals (particularly 60 Hz) in the output 58, before detection. This is useful because the detector 64 is essentially a peak detector and cannot distinguish between the envelope signal around the signal at the frequency of the signal generator 28 and additive signals at the base band. In the exemplary system, the high pass filter 62 comprises a 2-pole filter with a 10 KHz cut-off frequency.

The detector 64 is operatively coupled to the output of the high pass filter 62, and, for example, comprises a simple diode detector, which is the principal non-linear factor in the circuit. Accordingly, the drive into the detector is preferably maintained at a constant amplitude so as to reduce the effect of this non-linearity.

The output of the detector 64 is operatively coupled to a low pass filter 66, the output from which is operatively coupled to a DC offset removal circuit 68 which provides for adjustable DC offset removal, for example using an inverting amplifier that sums output from the low pass filter 66 with the output from a D/A converter under control of a microprocessor. This allows for subsequent DC amplification of the resulting signal. The output of the DC offset removal circuit 68 is then operatively coupled to an amplifier 70, which for example has two different outputs, each with a different associated gain, a low gain output with a gain of 4 and a high gain output with a gain of 20. In the exemplary system, the low pass filter 66 comprises a 2-pole low pass-filter with a 1 KHz cut-off frequency. Moreover each of the output stages provides single pole low pass filtering with a cut-off frequency of 500 Hz.

The behavior of the in-phase and out-of-phase modes of operation of an elementary proximity sensor 10 is illustrated in FIGS. 2–5 which provide the results of two dimensional (2-D) electrostatic simulations—using a 2-D simulation package called Macsyma/PDEase—of the voltage fields around the proximity sensor 10 and the electric field intensity at the surface of the sense electrode 12, wherein the sense electrode 12 is 20 cm wide, the control electrodes 14 on each side thereof are each 10 cm wide and separated therefrom by a 3 cm gap, both the sense 12 and control 14 electrodes are located at Y=0 centered about X=0, and +10 Volt is applied to the sense electrode 12. The simulation further comprised a grounded 15 cm diameter circular target (electric-field-influencing media 20) located 20 cm from the centerline of the sense electrode 12.

Figure 2:
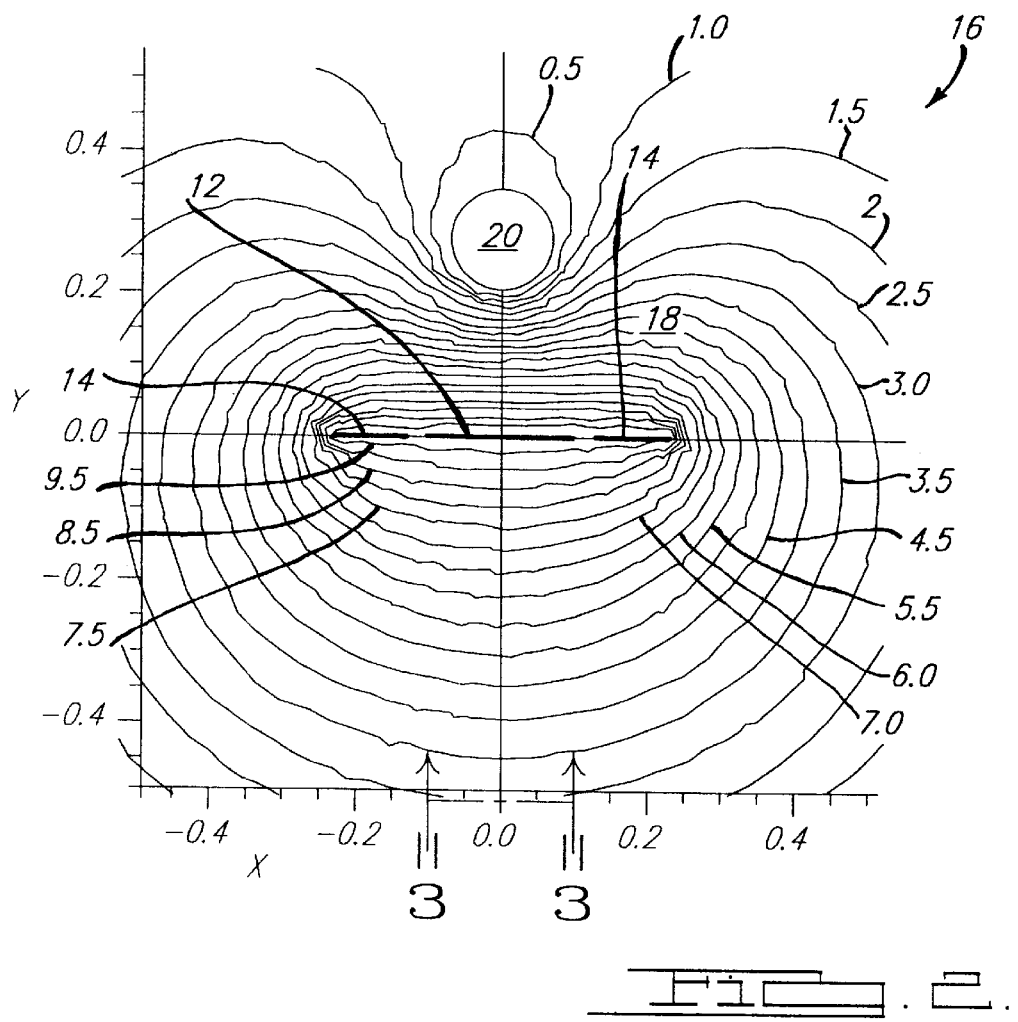
FIG. 2 is a contour plot of the electric field potential for a three plate capacitor in XY Space, for an in-phase (IP) mode of operation.

The proximity sensor 10 is simulated in the in-phase (IP) mode by applying a +10 Volt signal to the control electrodes 14. Referring to FIG. 2, the contours of the contour plot of the associated potential field of the proximity sensor 10 are largely spherical with the intensity falling off sharply close to the sensor. The field of the three electrodes is substantially identical to that of one large electrode, except that only the capacitance of the sense electrode 12 portion is actually measured. The boundary conditions of the target forces the voltage to be zero on the surface thereof, thereby increasing the gradient of the potential field, thereby increasing the electric field 16 and the charge on the sense electrode 12, thereby increasing the capacitance thereof.

Figure 3:
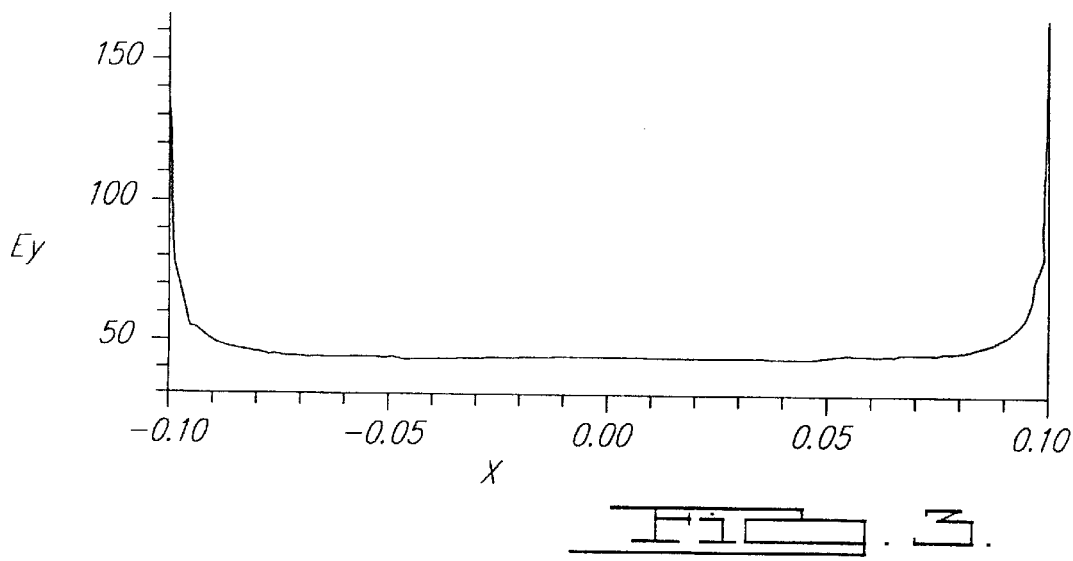
FIG. 3 is a plot of the Y-component of the electric field as a function of position along the sense electrode surface of a three plate capacitor for the in-phase (IP) mode of operation illustrated in FIG. 2.

FIG. 3 illustrates the electric field intensity at the surface of the sense electrode 12 for the in-phase (IP) mode illustrated in FIG. 2. Because the sense electrode 12 is a conductor, the E-field is perpendicular at the surface thereof, although the direction of the E-field changes as the E-field moves out into free space. Also, the charge distribution on the sense electrode 12 is proportional (by the dielectric constant) to the normal E-field intensity. Accordingly, FIG. 3 is also a plot of the charge density on the sense electrode 12. The capacitance can be calculated by integrating the charge and dividing by the applied voltage (C=Q/V).

Alternately, the simulation provides the integral of the E-field distribution, from which the in-phase capacitance $C_{IP}$ of the sense electrode 12 can be calculated by:

$$C = \frac{\varepsilon_0 Z_{length} \int E_{normal} dA}{V} = 8.854 * 9.262 * .2/10 = 1.6 \text{ pF}$$

This assumes that the height of the sensor is 20 cm. The result is approximate because a real 3-D sensor would have edges, and only the capacitance contribution of the top side of the sensor is included.

For capacitive sensors, the charge distribution on the associated electrode is typically U-shaped as shown in FIG. 3, which results from the boundary condition that the tangential E-field be zero on the conductor. This smoothing effect makes it difficult to even theoretically get much information about the location and shape of possible targets from the charge distribution. Basically, the charge on the sensor can be broken into two (or four for 3-D cases) edges and a center region. Measuring these three (or five) values could give information about the location of targets. Detailed analysis of the shape of the charge distribution would principally be useful for relatively close targets. The sensor essentially maps the entire complex target space onto this U-shaped distribution.

Figure 4:
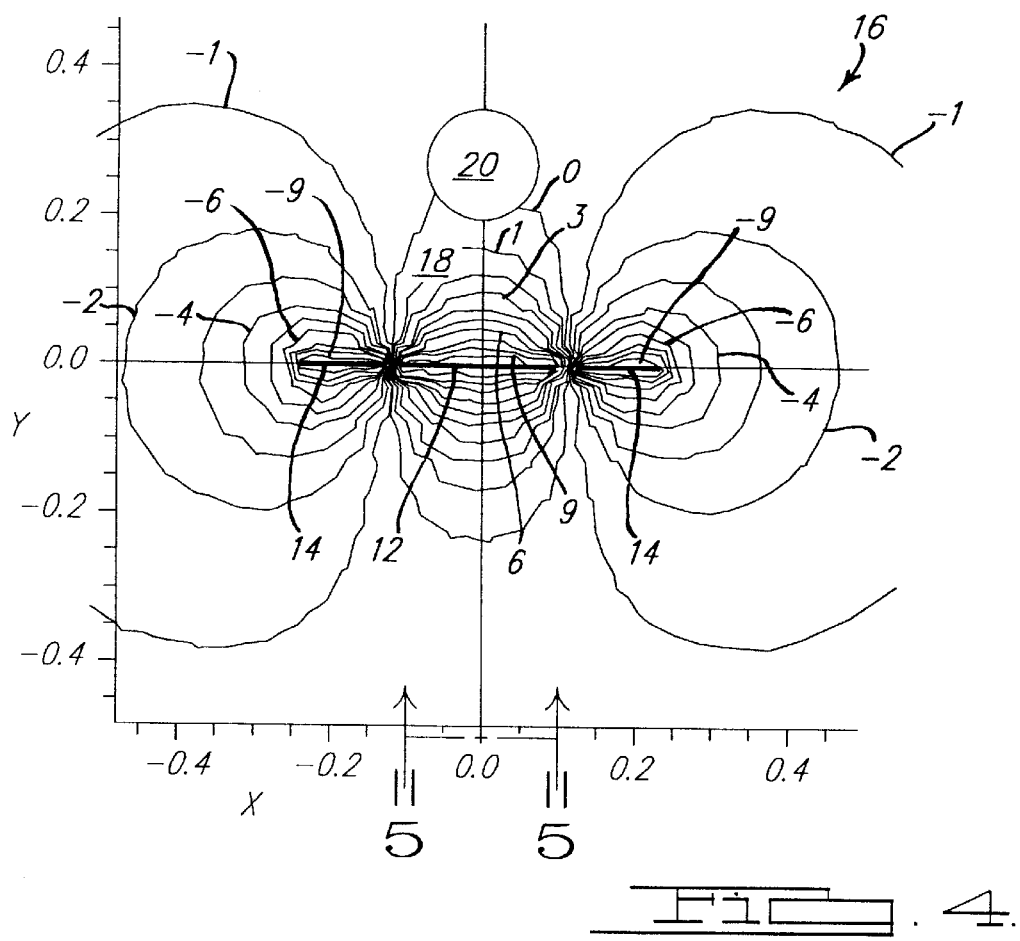
FIG. 4 is a contour plot of the electric field potential for a three plate capacitor in XY Space, for an out-of-phase (OOP) mode of operation.
Figure 5:
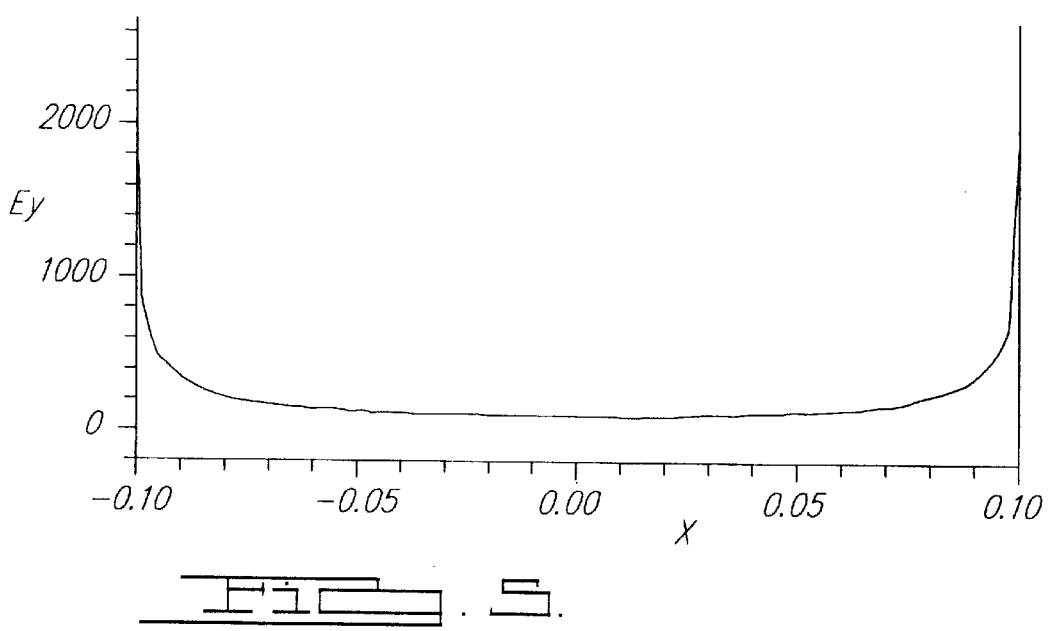

The proximity sensor 10 is simulated in the out-of-phase (OP) mode by applying a −10 Volt signal to the control electrodes 14. FIG. 4 illustrates a contour plot of the potential field for the same geometric configuration as in FIG. 2, but with the control electrodes 14 switched to the out-of-phase (OP) mode. Unlike the in-phase case, in which the contours are largely spherical, the out-of-phase case has a zero voltage interface in the gaps between the sense 12 and control 14 electrodes. The voltages for the out-of-phase (OP) mode cancel relatively close to the proximity sensor 10 so that the potential field does not extend relatively far therefrom, resulting in a relatively short range proximity sensor 10. Because the potential falls off sharply, grounded targets (electric-field-influencing media 20) would need to be located relatively close to the proximity sensor 10 in order to have an effect on the associated electric field 16. In the configuration of FIG. 4, the target is barely disrupting the field and so that its effect on the capacitance of the sense electrode 12 is relatively small.

Figure 5:
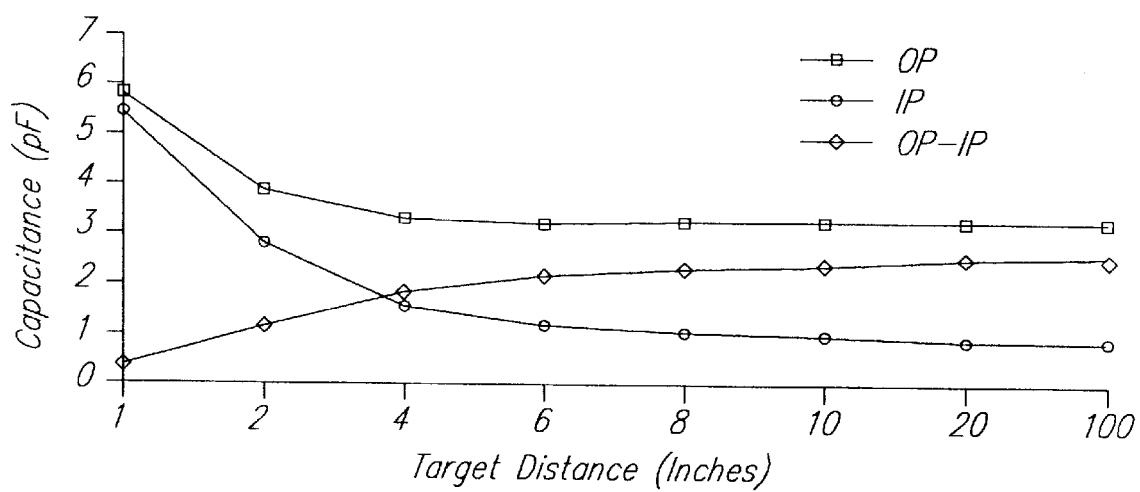
FIG. 5 is a plot of the Y-component of the electric field as a function of position along the sense electrode surface of a three plate capacitor for the OOP mode of operation illustrated in FIG. 4.

Referring to FIG. 5, the E-field and charge distribution for the out-of-phase (OP) mode has a similar U-shape as for the associated in-phase (IP) mode illustrated in FIG. 3, but with substantially higher magnitudes, particularly at the edges, because of the high field strengths between the sensor and control electrodes. For the out-of-phase (OP) mode, the maximum E-field at the edge is 2200 V/m, while for the in-phase (IP) mode, the corresponding maximum is only 125 V/m. The E-field strength at the center is about 100 V/m for the out-of-phase (OP) mode, compared with about 40 V/m for the in-phase (IP) mode.

The out-of-phase capacitance $C_{OP}$ of the sense electrode 12 is given by:

$$C = \frac{\varepsilon_0 Z_{length} \int E_{normal} dA}{V} == 8.854 * 36.73 * .2/10 = 6.5 \text{ pF}$$

Accordingly, the out-of-phase capacitance $C_{OP}$—about 6.5 pF—of the sense electrode 12 is about four times the in-phase capacitance $C_{IP}$ —about 1.6 pF. The absolute capacitance of the sensor in the out-of-phase (OP) mode is larger than that of the in-phase (IP) mode, but the in-phase (IP) capacitance increases more sharply as targets become closer to the sense electrode 12.

FIG. 6 illustrates a comparison of the simulation results for the in-phase capacitance $C_{IP}$ and out-of-phase capacitance $C_{OP}$ as a function of the distance to a relatively large conductive sheet target. The out-of-phase capacitance $C_{OP}$ is larger, but is practically level after 4 inches. The in-phase capacitance $C_{IP}$ is much smaller, but almost equals the out-of-phase capacitance $C_{OP}$ for close-in targets. The difference $C_{OP}$—$C_{IP}$ (hereinafter referred to as "DeltaCap") decreases as the target becomes closer.

Accordingly, DeltaCap provides a measure of target distance, and by using this measure, this also provides a means for compensating for offsets that are common to both the in-phase (IP) and out-of-phase (OP) measurements, because switching the sensor from in-phase (IP) to out-of-phase (OP) modes principally affects the fields around the proximity sensor 10, and offsets in the associated first circuit 42 common to both measurements are cancelled during the calculation of DeltaCap.

Whereas the means measuring capacitance by the first circuit 42 provides a voltage that is roughly linear with the sensor capacitance, there are, however, a number of associated gain factors in the first circuit 42 that are susceptible to drift. Referring to FIGS. 7a–f, a switchable calibration capacitor $C_{CAL}$ can be used to compensate for this drift, and to provide a sensitivity factor in units of V/pF that can be used to calibrate the system.

Figure 7A:
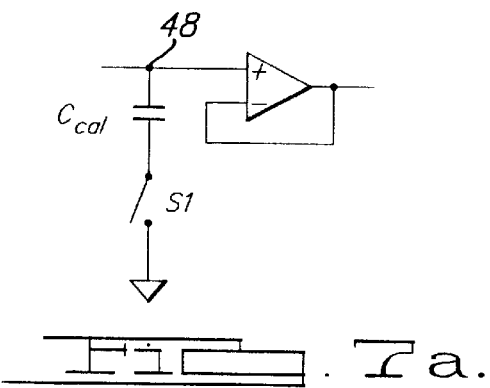
FIGS. 7a–f illustrate various embodiments for switching a calibration capacitor.
Figure 7B:
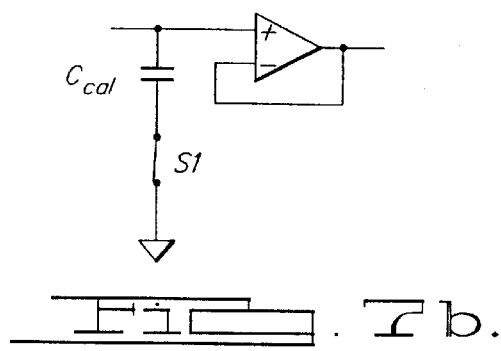

Operatively coupling a relatively small (e.g. 1 pF or less) capacitance can be subject to error, depending upon the associated switching arrangement. For example, in FIGS. 7a–b, one terminal of the calibration capacitor $C_{CAL}$ is connected to the first node 48, and the other terminal thereof is connected to ground through a switch S1. Referring to FIG. 7b, whereas this configuration is satisfactory when the switch S1 is closed, referring to FIG. 7a, when the switch is opened the capacitance of the switch S1 is typically larger than that of the calibration capacitor $C_{CAL}$. For example, a typical FET may have an OFF capacitance of 40 pF, so that if the calibration capacitor $C_{CAL}$ is 1 pF, then the series combination is 0.98 pF, which means that the calibration capacitor $C_{CAL}$ is effectively never switched out of the circuit by the switch S1.

Figure 7C:
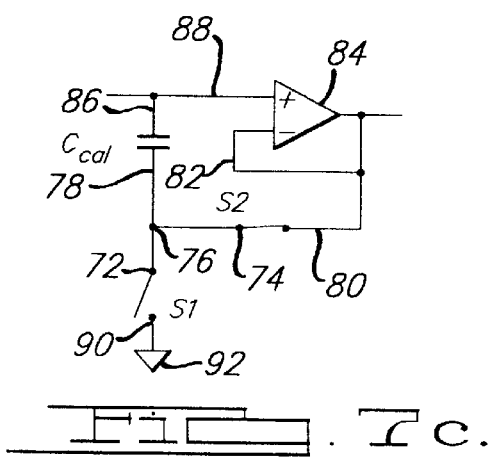
Figure 7D:
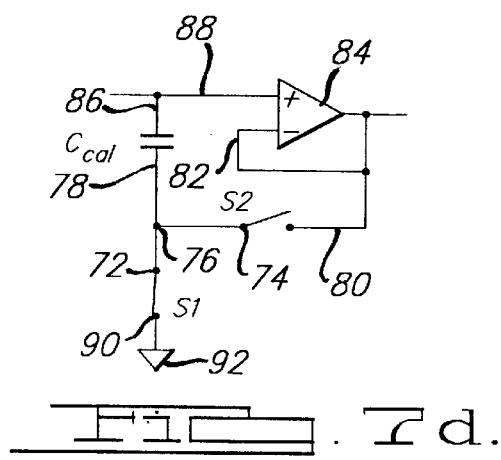
Figure 7E:
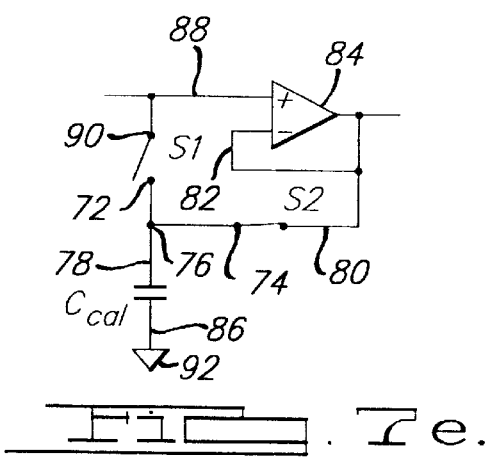
Figure 7F:
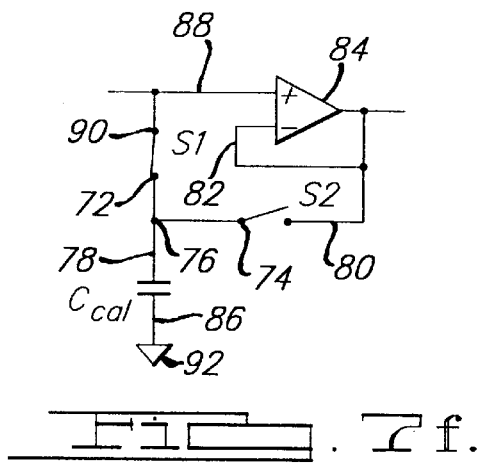

Referring to FIGS. 1a and 7c–f, a first terminal 72 of a first switch S1 is operatively coupled to a first terminal 74 of a second switch S2 at a second node 76, and a first terminal 78 of a capacitor $C_{CAL}$ is operatively coupled to the second node 76. A second terminal 80 of the second switch S2 is operatively coupled to a first input 82 of an operational amplifier 84. Referring to FIGS. 7c–d, a second terminal 86 of the capacitor $C_{CAL}$ is operatively coupled to a second input 88 of the operational amplifier 84 and a second terminal 90 of the first switch S1 is operatively coupled to a circuit ground 92. Referring to FIGS. 7e–f the second terminal 90 of the first switch S1 is operatively coupled to the second input 88 of the operational amplifier 84 and the second terminal 86 of the capacitor $C_{CAL}$ is operatively coupled to the circuit ground 92.

Referring to FIGS. 7d and 7f, when the first switch S1 is closed and the second switch S2 is open, one side of capacitor $C_{CAL}$ is pulled to ground and the capacitor $C_{CAL}$ is operatively coupled to the second node 76, so as to add the capacitance $C_{CAL}$ thereto. Referring to FIGS. 7c and 7e, when the first switch S1 is opened and the second switch S2 is closed, one terminal of the capacitor $C_{CAL}$ is driven by a buffered version of the signal on the other terminal of the capacitor $C_{CAL}$ as a result of the property of the operational amplifier 84 to substantially null a potential difference between the associated first 82 and second 88 inputs thereof. To the extent that these signals have identical voltages, there is substantially no current flowing through the capacitor $C_{CAL}$ and the capacitor $C_{CAL}$ is effectively switched out.

Figure 8A:
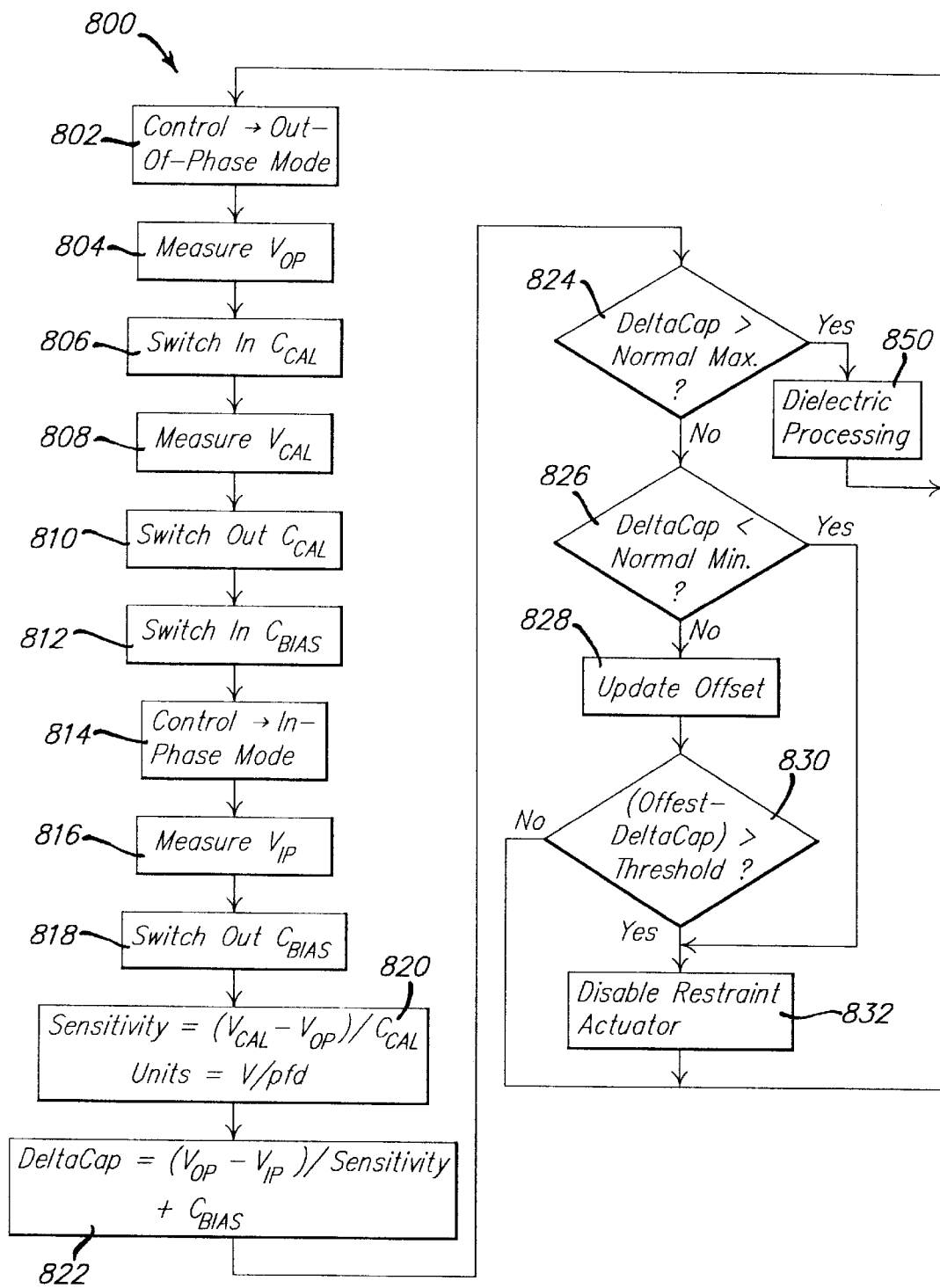
FIG. 8 illustrates a flow chart of the operation of a proximity sensor.

Referring to FIG. 8a, illustrating an example of an algorithm (800) to detect the proximity of an object to a proximity sensor 10, in step (802) the second oscillatory signal 30 is switched to the out-of-phase (OP) mode by the control electrode driver 32 and the control electrodes 14.1, 14.2 and 14.3 are driven with an out-of-phase (OP) signal. In step (804) the associated third signal 50 ($V_{OP}$) is measured by the first circuit 42. Then in step (806), the calibration capacitor $C_{CAL}$ is operatively coupled to the first node 48 by activating FET transistor Q1a and deactivating FET transistor Q2a, and in step (808) the associated fifth signal 94 ($V_{CAL}$) is measured by the first circuit 42, after which in step (810) the calibration capacitor $C_{CAL}$ is decoupled from the first node 48 by deactivating FET transistor Q1a and activating FET transistor Q2a. In step (812), the bias capacitor $C_{BIAS}$ is operatively coupled the first node 48 by activating FET transistor Q1b and deactivating FET transistor Q2b, and in step (814) the second oscillatory signal 30 is switched to the in-phase (IP) mode by the control electrode driver 32 and the control electrodes 14.1, 14.2 and 14.3 are driven with an in-phase (IP) signal. In step (816) the associated fourth signal 52 ($V_{IP}$) is measured by the first circuit 42, after which in step (818), the bias capacitor $C_{BIAS}$ is decoupled from the first node 48 by deactivating FET transistor Q1b and activating FET transistor Q2b.

In step (820), a sensitivity factor for calibrating the first circuit 42 is calculated, in units of Volts per unit of capacitance, for example V/pF, as follows:

Sensitivity=$(V_{CAL}-V_{OP})/C_{CAL}$

In step (822), the DeltaCap measure is calculated using this sensitivity factor, as follows:

DeltaCap=$(V_{OP}-V_{IP})$/Sensitivity+$C_{BIAS}$

Figure 9:
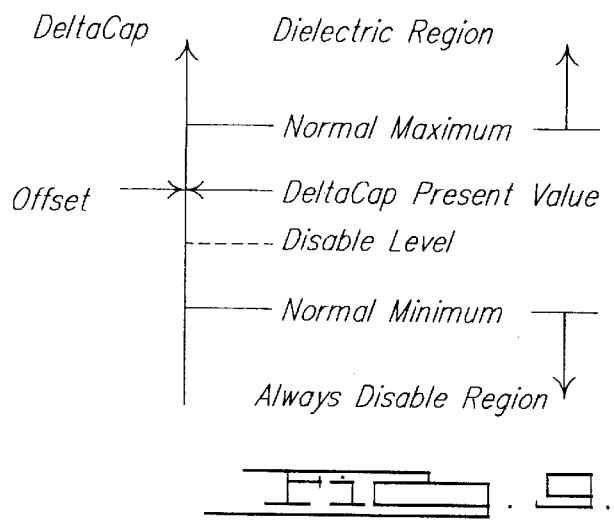
FIG. 9 illustrates various regions of a DeltaCap measure.

When no objects are present, the DeltaCap measure is maintained within a range by the above described calibration process. Referring to FIG. 9, illustrating a one-dimensional plot of the DeltaCap measure, should the DeltaCap measure drop below the normal minimum, into the "always disable" region, this would indicate the presence of a target in the sensing region. For example, with the proximity sensor 10 used to detect an object proximate to a restraint actuator 96 of a safety restraint system, this would indicate that the restraint actuator 96, for example and air bag inflator, should be disabled so as to prevent injury to an occupant proximate thereto as a result of the deployment thereof. When the DeltaCap measure is in the normal region, a long term average of the DeltaCap measure is calculated, and is referred to herein as the offset. If the DeltaCap measure drifts slowly due to temperature or time, the offset slowly tracks these changes. If the DeltaCap measure drops quickly by a given threshold amount below the offset, this would indicate the presence of a target proximate to the proximity sensor 10 so that the restraint actuator 96 would be disabled. However, over time the offset would adjust down and the restraint actuator 96 would become re-enabled. The DeltaCap measure is allowed to drift within the normal region and is slowly tracked by the offset. For small changes in the DeltaCap measure (for example as a result of far targets), a threshold below the present offset is used for disabling the restraint actuator 96. As a target moves close to the proximity sensor 10 and the DeltaCap measure decreases significantly, the DeltaCap measure enters the "always disable" region. When the DeltaCap measure is in the "always disable" region, the offset is not updated.

A special condition is when a large dielectric object is placed on the proximity sensor 10, or if the proximity sensor 10 is sprayed with water, wherein the DeltaCap measure may be shifted up, which is opposite to the change caused by a grounded target. If the DeltaCap measure is above the normal maximum, then special techniques are necessary for detecting targets, as described hereinbelow.

Returning to FIG. 8a, in step (824), if the DeltaCap measure exceeds the normal maximum, then In step (850) a dielectric processing algorithm is called as will be described hereinbelow in conjunction with FIG. 8b. Otherwise, if in step (826) the DeltaCap measure is less than the normal minimum, then the restraint actuator 96 is disabled in step (832) and the process repeats with step (802). Otherwise from step (826) the offset, for example a running average of the DeltaCap measure, is updated in step (828) and if in step (830) the offset exceeds the DeltaCap measure by more than a threshold, the restraint actuator 96 is disabled in step (832) and the process repeats with step (802). Otherwise, from step (830), the process repeats with step (802).

Figures 10A, 10B:
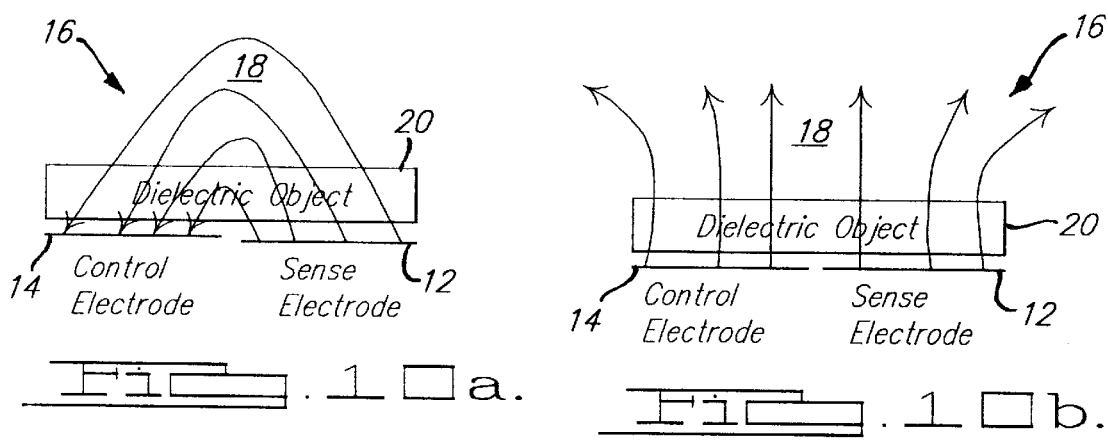
FIG. 10a illustrates the effect of a dielectric on a proximity sensor operated in an out-of-phase (OP) control mode.
FIG. 10b illustrates the effect of a dielectric on a proximity sensor operated in an in-phase (IP) control mode.

The DeltaCap measure provides a difference between an out-of-phase (OP) capacitance and an in-phase (IP) capacitance, which inherently reduce drifts because any common-mode effects in the first circuit 42 are substantially cancelled by the differencing process. However, one undesirable side-effect of the DeltaCap measure is an increased sensitivity to dielectric objects. Referring to FIGS. 10a–b, the out-of-phase (OP) capacitance of FIG. 10a is increased more than the in-phase (IP) capacitance of FIG. 10b for dielectric objects close to the sensor. The capacitance is increased by the dielectric object in proportion to the amount of the electric field in the dielectric and the dielectric constant of the object. In the out-of-phase (OP) mode, the fields are contained close to the electrode surface and so more of the electric field travels through the dielectric object. In the in-phase (IP) mode, the fields pass through the dielectric, but most of the field is in air, resulting in only a marginal increase of capacitance.

The principal manifestation of this effect is from thick dielectric objects relatively close to the proximity sensor 10, such as from books or from water on the proximity sensor 10. Typically, one section of newspaper is not enough to increase the DeltaCap measure. A dielectric object tends to increase the DeltaCap measure, which is the opposite to the effect of a person who is typically grounded, so the sensor would not normally cause the restraint actuator 96 to disable as a result of the presence of such an object.

This problem is mitigated by either 1) using an in-phase guard band around the sensor, 2) using the change in the in-phase (IP) capacitance as a back up measure for disabling the restraint actuator 96, or 3) using the changes in the in-phase (IP) and out-of-phase (OP) capacitances to deduce that a dielectric object is present and then rapidly updating the offset.

Referring to FIG. 1a, a proximity sensor 10 is illustrated with three control electrodes 14.1, 14.2 and 14.3 and a guard 98 around the sense electrode 12. This is just and example one possible arrangement. The arrangement of the electrodes can generally be adapted in accordance with constraints of the region 18 to be sensed. As was illustrated in FIG. 5, the charge distribution for the out-of-phase (OP) mode has relatively high peaks at the edges. When the dielectric increases the capacitance of the sense electrode 12, the bulk of the extra charge travels to the edges of the sense electrode 12. The guard 98 is driven in-phase (IP) with the sensor, causing this extra charge to be on the guard, but because the guard is not electrically connected to the sense electrode 12, this charge is not measured. Accordingly, the guard reduces the effect of dielectrics on the out-of-phase (OP) capacitance of the sense electrode 12.

Figure 11:
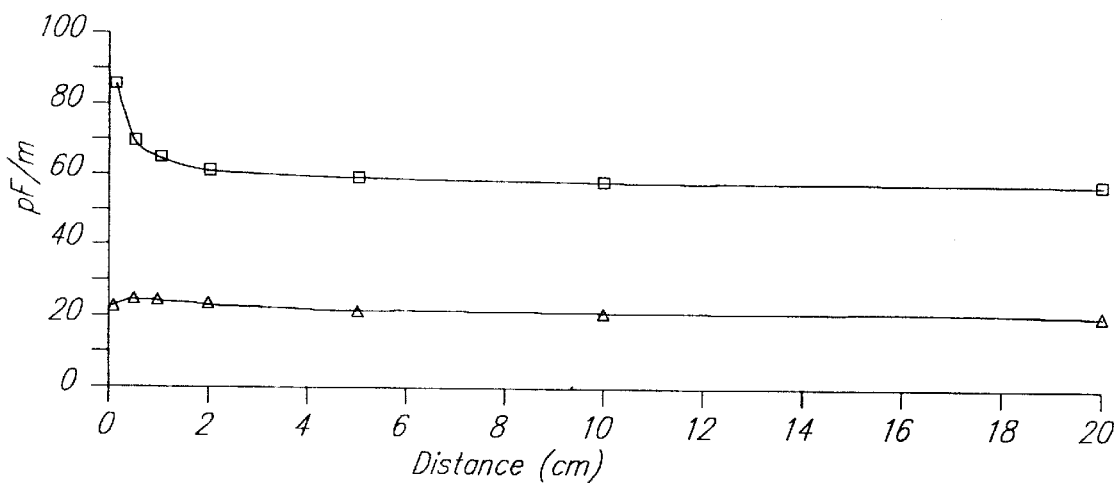
FIG. 11 illustrates the effect of a dielectric on the capacitance of a proximity sensor as a function of distance for an out-of-phase (OP) control mode, with and without an in-phase (IP) guard.

FIG. 11 illustrates the results of a simulation in which a 5 mm dielectric having a relative permittivity of 3 is placed at various distances. The guard reduces both the out-of-phase (OP) capacitance and the sensitivity to dielectrics. The effect of the dielectric is noticeable primarily within a short range, for example less than 3 inches.

Figure 12:
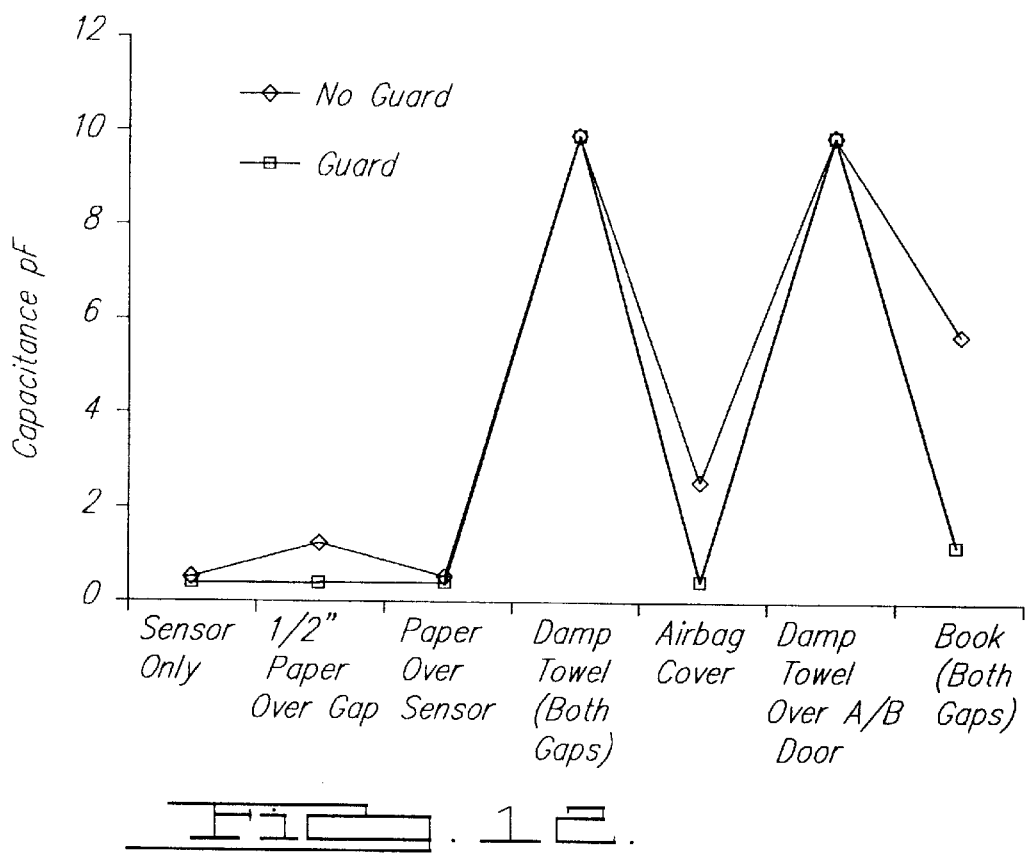
FIG. 12 illustrates the effect of an in-phase (IP) guard on the capacitance of a proximity sensor for various dielectric objects.

FIG. 12 illustrates actual test data in which various dielectric objects are placed on a sensor, with and without the guard. The guard reduces the effect of these objects, except for the wet towel cases. Wet towels are particularly difficult because they are conductive as well as having a large dielectric constant.

A second technique of mitigating dielectric effects is to consider only the in-phase (IP) capacitance, since the in-phase (IP) capacitance is not drastically affected by dielectrics. When a target approaches the sensor, the in-phase (IP) capacitance increases. Although the absolute value of the in-phase (IP) capacitance is not reliable, the change therein over time can be calculated.

A measure referred to as DeltaIP is calculated and used to calculate a measure called DynamicIP which this tracks the change of the in-phase capacitance, as follows:

$$\text{DeltaIP }(k)=C_{IP}(k)-C_{IP}(k-1)$$

$$\text{DynamicIP }(k)=\text{DynamicIP}(k-1)+\text{DeltaIP }(k)-\text{dampingfactor}$$

(DynamicIP must be>=0)

As an example, if the DeltaCap measure is increased above the offset, the system is still be able to disable for a target moving into the danger zone by checking if the DynamicIP measure is greater than a threshold. This works even if a large book is over the sensor, but principally works for moving targets.

The third technique for mitigating the effect of dielectrics and water is to monitor the changes in the in-phase (IP) and out-of-phase (OP) capacitances and use that information to categorize the situation. Then, if necessary, the offset can be quickly updated. For example, grounded targets increase the in-phase (IP) capacitance more than the out-of-phase (OP) capacitance, while dielectric objects increase the out-of-phase (OP) capacitance more than in-phase (IP) capacitance.

Figure 13:
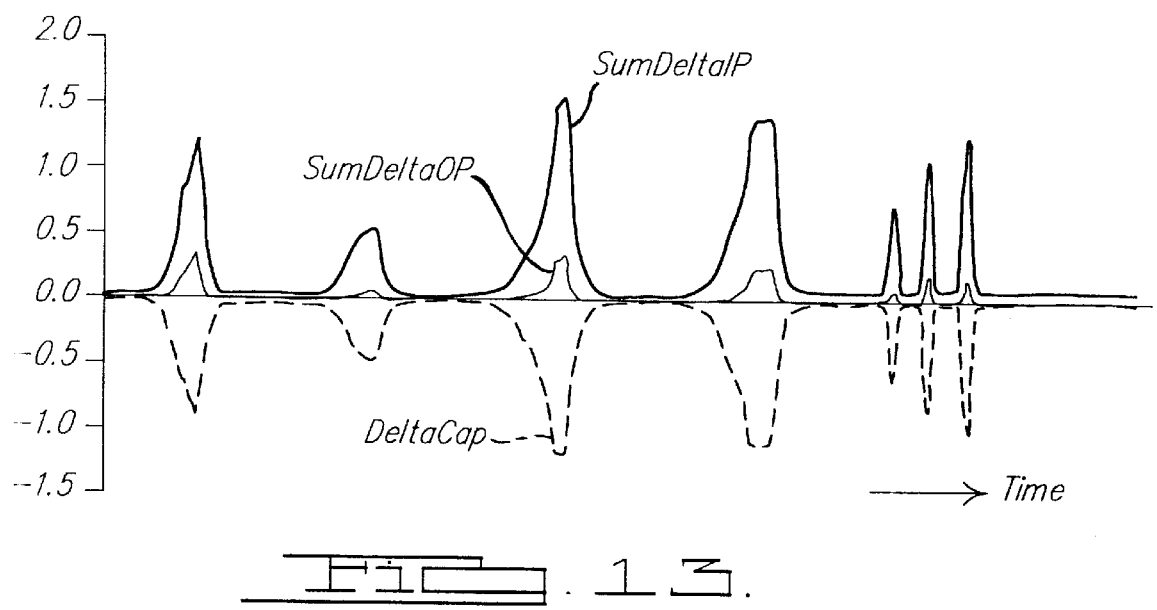
FIG. 13 illustrates various measures for targets moving closer to and farther from a proximity sensor.
Figure 14:
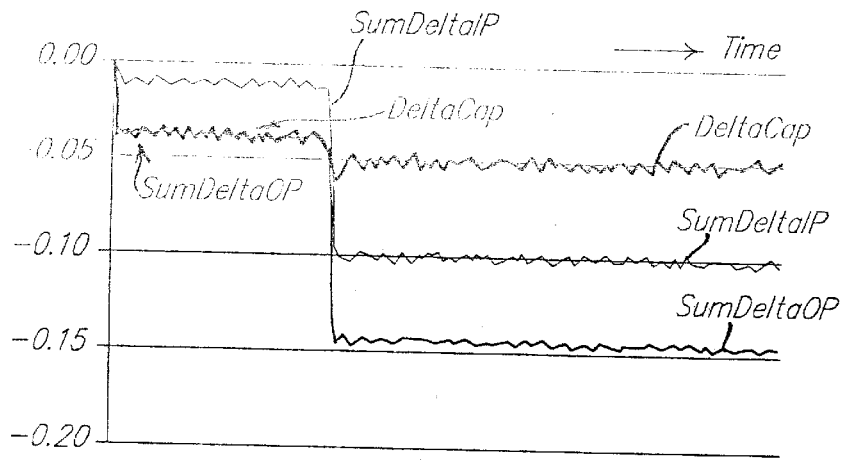
FIG. 14 illustrates various measures for a dielectric target moving away from a proximity sensor.

FIG. 13 illustrates a rounded target moving closer to and farther away from the proximity sensor 10. FIG. 14 illustrates a dielectric (i.e. a magazine) moving away from the proximity sensor 10. For both a grounded target moving towards the sensor and for a dielectric object moving away from the sensor, the DeltaCap measure deceases. But for the grounded target case, most of the change is due to the in-phase (IP) capacitance, while for the dielectric case the out-of-phase (OP) change is greater than the in-phase (IP) change. If these cases can be separated, then the offset can be quickly updated for the dielectric case and slowly updated for the target case.

Figure 8B:
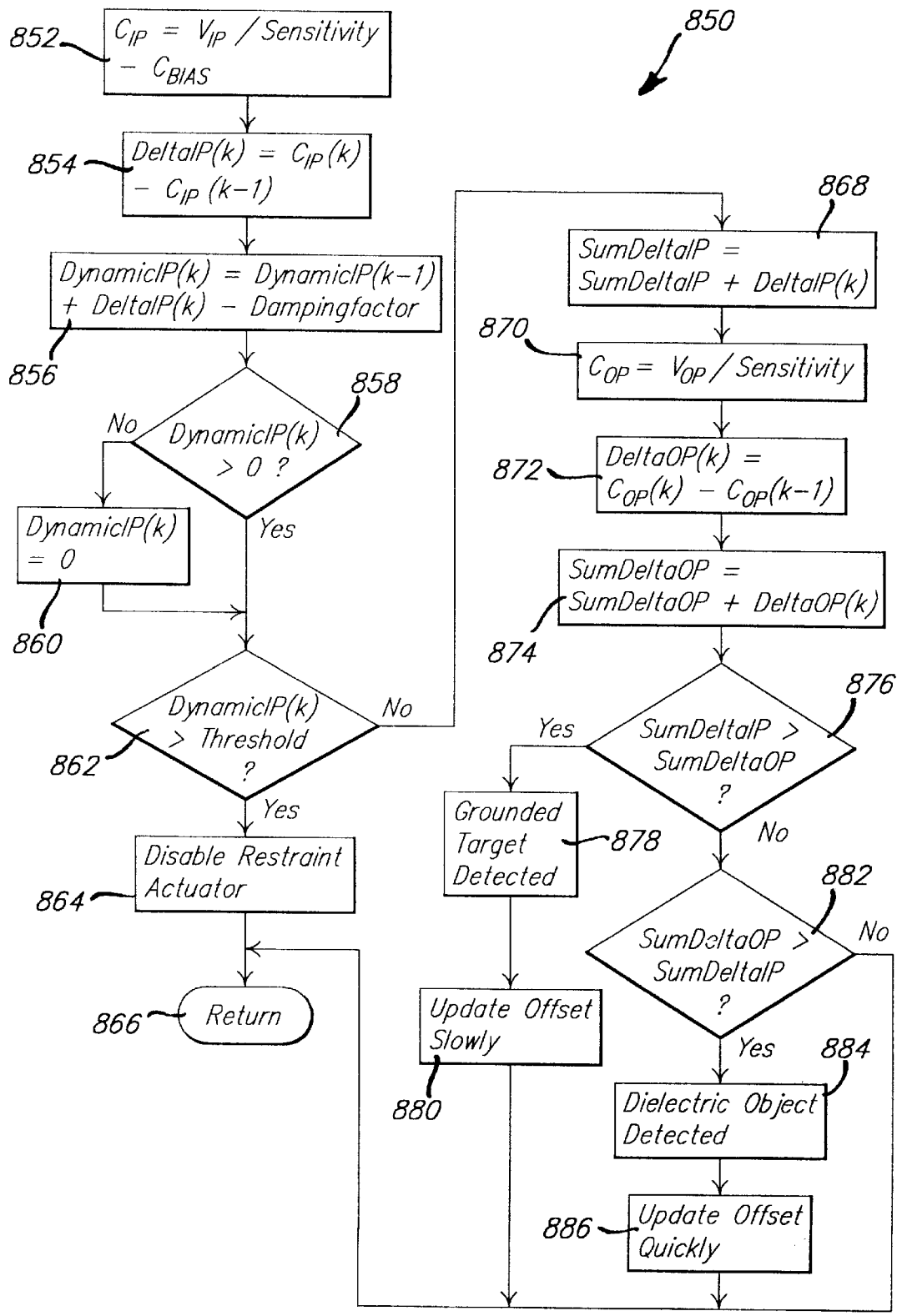

Referring to FIG. 8b, illustrating a dielectric processing algorithm (850), in step (852) an in-phase capacitance $C_{IP}$ is calculated from the fourth signal 52 ($V_{IP}$) and the sensitivity factor as follows:

$$C_{IP}=V_{IP}/\text{Sensitivity}-C_{BIAS}$$

In step (854) a DeltaIP measure is calculated from the change in in-phase capacitance $C_{IP}$ over time, as follows:

$$\text{DeltaIP }(k)=C_{IP}(k)-C_{IP}(k-1)$$

In step (856) a DynamicIP measure is calculated using a damping factor, as follows:

$$\text{DynamicIP }(k)=\text{DynamicIP }(k-1)+\text{DeltaIP }(k)-\text{damping\_factor}$$

If in step (858) the DynamicIP measure is less than zero, then in step (860) the present value of the DynamicIP measure is set to zero. Otherwise, if in step (862) the DynamicIP measure is greater than a threshold, then in step (864) the restraint actuator 96 is disabled and in step (866) the process returns to step (802). Otherwise from step (862), in step (868) a SumDeltaIP measure is calculated as a running sum of the DeltaIP measures over time. In step (870), an out-of-phase capacitance $C_{OP}$ is calculated from the third signal 50 ($V_{OP}$) and the sensitivity factor as follows:

$$C_{OP}=V_{OP}/\text{Sensitivity}$$

In step (872) a DeltaOP measure is calculated from the change in out-of-phase capacitance $C_{OP}$ over time, as follows:

$$\text{DeltaOP }(k)=C_{OP}(k)-C_{OP}(k-1)$$

In step (874) a SumDeltaOP measure is calculated as a running sum of the DeltaOP measures over time. If in step (876) the SumDeltaIP measure is greater than the SumDeltaOP measure, then in step (878) a grounded target is assumed to be present, and in step (880) the offset is continued to be updated slowly, after which in step (866) the process returns to step (802). Otherwise from step (876), if in step (882) the SumDeltaOP measure is greater than the SumDeltaIP measure, then in step (884) a dielectric object is assumed to be present, and in step (886) the offset is updated quickly, after which in step (866) the process returns to step (802).

Figure 15:
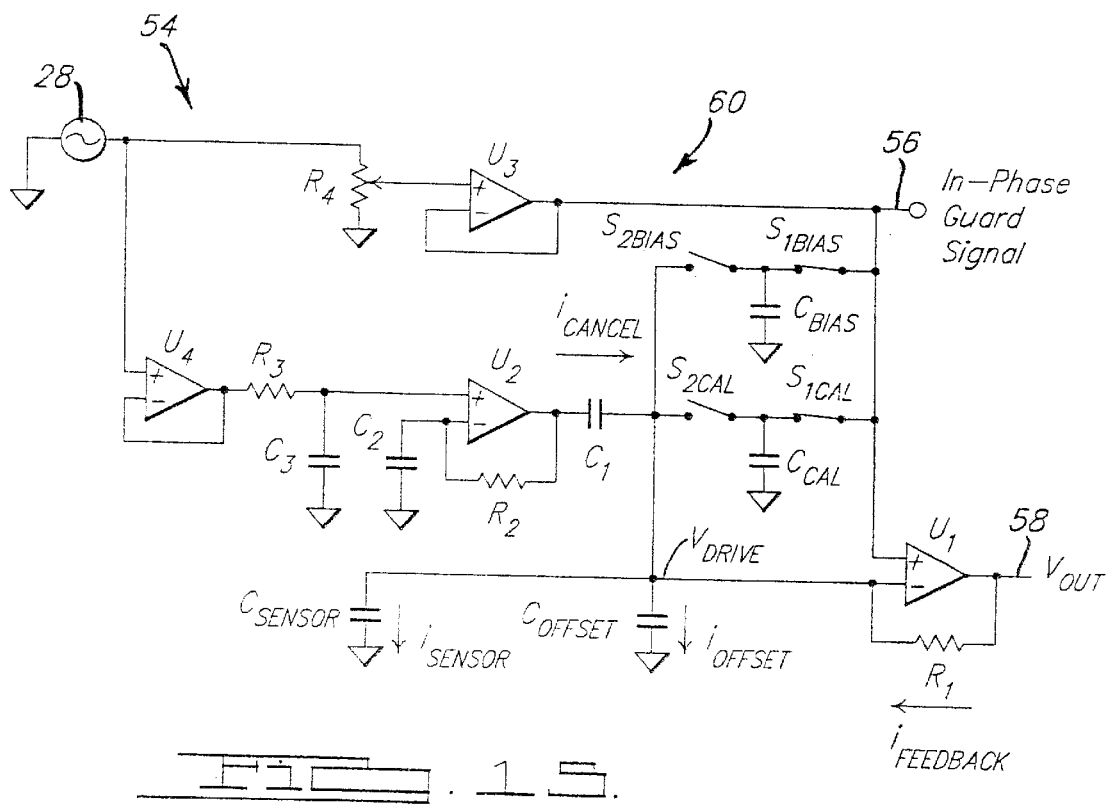
FIG. 15 illustrates a front-end amplifier with an offset canceling circuit in accordance with the instant invention.

FIG. 15 illustrates a schematic of the front end amplifier 54, comprising an amplifier $U_1$ and an offset canceller $U_2$, and the associated calibration and bias capacitor circuitry.

The amplifier $U_1$ can be understood as a current to voltage converter. The non-inverting input is driven with a sinusoid and because of the properties of the op-amp the same voltage is present on the inverting input. The signal on the inverting input drives the sensor electrode and a AC current flows out of the sensor. This same current flows through the feedback resistor $R_1$ and this generates the change in the output.

The circuit can also be understood as a non-inverting amplifier with a transfer function of:

$$\text{Vout}=V+(1+j\omega RC)$$

This circuit has the following properties:
1. If there is no capacitance then the output is the same as the drive signal on the non-inverting input (i.e. it is a voltage follower).
2. As the capacitance of the sensor increases, the output voltage increases and also starts to go out of phase with the drive voltage.

3. The change in output voltage is linearly related to the frequency of the drive signal, the size of the feedback resistor $R_1$, and the magnitude of the drive voltage, and the change in the capacitance.
4. If there is a large offset capacitance, then the gain must be low or the output voltage will be saturated. Accordingly, an offset canceling circuit is incorporated to prevent this problem.
5. The circuit stops working well above about 100 KHz because the op-amps begin to become non-ideal. The circuit requires that the feedback current is such that the inverting input is kept at the same voltage as the non-inverting input.

The following design considerations can be used in configuring the first circuit 42:

1. Higher operating frequencies provide for higher associated current to the sense electrode 12, but the frequency is preferably limited to that range for which the performance of the operational amplifier remains reasonably ideal.
2. The size of the drive signal is preferably as large as possible for increased signal-to-noise ratio, but is preferably not so large as to saturate—or rail—the output voltage as the measure of capacitance increases. Generally, both noise currents and signal currents are amplified, so it is desirable to make the signal currents as large as possible.
3. The feedback resistor $R_1$ can be set to provide the desired sensitivity. The change in output voltage due a change in capacitance is:

$$\Delta V_{out}(dc) = \alpha \times \omega \times R_1 \times V_{drive}(peak) \times Gain(dc) \times \Delta Capacitance$$

where $\alpha$ is dependent on the circuit capacitance but is usually 0.7–0.9. For example, if it is desired to have a 40 mV output change for a 0.01 pf change in capacitance then with $$\alpha=0.8, \omega=6.28\times10^5, V_{drive}(peak)=1V, Gain(dc)=20, \Delta Capacitance=10^{14} \; R_1=0.04/(0.8\times6.28^5\times1\times20\times10^{-14})=398 \; K\Omega$$

The remainder of the circuit is used to adjust the current going in and out of the inverting input node. A large offset capacitance can cause a large offset current which can saturate the output voltage at the desired gain level. These offset capacitances can come from the circuit, or the wire going to the sensor, or the back side of the sensor. Amplifier $U_2$ is designed to generate a signal which is in-phase with the sensor drive signal (inverting input). If the output of $U_2$ is made larger, it will inject current that cancels some of this offset current. Buffer amplifiers $U_3$ and $U_4$ allow the drive to amplifier $U_2$ and to amplifier $U_1$ to be adjusted in amplitude while staying in phase.

It will be understood by one of ordinary skill in the art that the means for controlling the state of the second oscillatory signal, the means for measuring the response signal from first electrode, the means for means for forming a difference of the third and fourth signals, the means for calibrating the difference, and the means for generating a measure of proximity of an object to the proximity sensor can be accomplished by various analog or digital circuits or by software using a computer, for example a microprocessor.

It should be understood that the first oscillatory signal 26 in general need not be either sinusoidal or periodic. Generally, an in-phase signal corresponding to the second state 40 undergoes similar transitions to the first oscillatory signal 26, and an out-of-phase signal corresponding to the first state 38 undergoes substantially opposite transitions to that of the first oscillatory signal 26. Whereas the signal generator 28 is illustrated herein as a sinusoidal oscillator, other types of signal generators 28 can be used, for example a logic circuit. The DC bias to the second oscillatory signal 30 can be either the same or different for different states 36.

The proximity sensor 10 can be used in a variety of applications, for example in a vehicle for detecting the proximity of an occupant to an air bag inflator so that the air bag inflator can be disabled if the occupant becomes located within an at-risk region proximate to the air bag inflator. For example, the proximity sensor can be located in a seat, in the instrument panel, in a cover to the air bag inflator, or in the steering wheel. The proximity sensor 10 may also be used for other proximity sensing applications.

While specific embodiments have been described in detail, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:

1. A proximity sensor for sensing an electric-field-influencing media within a region of space, comprising:
   a. a first electrode, wherein said first electrode is conductive;
   b. a first oscillatory signal operatively coupled to said first electrode;
   c. at least one second electrode, wherein said at least one second electrode is conductive and said at least one second electrode is separated from said first electrode;
   d. a second oscillatory signal operatively coupled to said at least one second electrode, wherein said second oscillatory signal comprises a state, said state is selected from a first state and a second state, when in a first state said second oscillatory signal has a first phase relative to said first oscillatory signal, when in a second state said second oscillatory signal has a second phase relative to said first oscillatory signal;
   e. a means for controlling said state of said second oscillatory signal;
   f. a means for measuring a third signal from said first electrode when said second oscillatory signal is in said first state;
   g. a means for measuring a fourth signal from said first electrode when said second oscillatory signal is in said second state;
   h. a means for forming a difference of said third and fourth signals; and
   i. a means for generating a measure of proximity of an object to said proximity sensor responsive to said difference.

2. A proximity sensor for sensing an electric-field-influencing media within a region of space as recited in claim 1, wherein said first phase is substantially out-of-phase with respect to said first oscillatory signal, and said second phase is substantially in-phase with said first oscillatory signal.

3. A proximity sensor for sensing an electric-field-influencing media within a region of space as recited in claim 1, wherein said at least one second electrode is located proximate to said first electrode so that an electric field between said first electrode and said at least one second electrode occupies said region of space, wherein said electric field is responsive to said first and second oscillatory signals.

4. A proximity sensor for sensing an electric-field-influencing media within a region of space as recited in claim 1, wherein said at least one second electrode is located outside a periphery of said first electrode.

5. A proximity sensor for sensing an electric-field-influencing media within a region of space as recited in claim 1, wherein said at least one second electrode comprises a plurality of second electrodes at least partially surrounding said first electrode, wherein said plurality of second electrodes are separated from one another.

6. A proximity sensor for sensing an electric-field-influencing media within a region of space as recited in claim 1, wherein said first oscillatory signal comprises an oscillatory voltage, further comprising a voltage divider comprising a capacitor and a terminal of said first electrode wherein one terminal of said capacitor is operatively coupled to said first electrode at a first node, another terminal of said capacitor is operatively coupled to said first oscillatory signal, said third signal is responsive to a voltage at said first node, and said fourth signal is responsive to a voltage at said first node.

7. A proximity sensor for sensing an electric-field-influencing media within a region of space as recited in claim 1, further comprising a means for calibrating said difference.

8. A proximity sensor for sensing an electric-field-influencing media within a region of space as recited in claim 1, further comprising:
   a. at least one third electrode at least partially between said first electrode and said at least one second electrode; and
   b. a fifth oscillatory signal operatively coupled to said at least one third electrode, wherein said fifth oscillatory signal is substantially in-phase with said first oscillatory signal.

9. A method of sensing the proximity of an electric-field-influencing media within a region of space, comprising:
   a. applying a first oscillatory signal to a first electrode;
   b. applying a second oscillatory signal to at least one second electrode, wherein said first and second oscillatory signals have a substantially common frequency of oscillation and said second oscillatory signal has a first phase relative to said first oscillatory signal;
   c. measuring a third signal from said first electrode, wherein said third signal is responsive to a capacitance of said first electrode;
   d. modifying a phase of said second oscillatory signal so that said second oscillatory signal has a second phase relative to said first oscillatory signal;
   e. measuring a fourth signal from said first electrode, wherein said fourth signal is responsive to a capacitance of said first electrode;
   f. generating a first difference of said third and fourth signals; and
   g. generating a measure of proximity of an object to said first electrode responsive to said first difference.

10. A method of sensing the proximity of an electric-field-influencing media within a region of space as recited in claim 9, wherein said first phase is substantially out-of-phase with said first oscillatory signal and said second phase is substantially in-phase with said first oscillatory signal.

11. A method of sensing the proximity of an electric-field-influencing media within a region of space as recited in claim 9, further comprising:
   a. operatively connecting a first capacitance to said first electrode;
   b. measuring a fifth signal from said first electrode, wherein said fifth signal is responsive to a combination of a capacitance of said first electrode and said first capacitance;
   c. operatively disconnecting said first capacitance from said first electrode; and
   d. generating a first factor responsive to a second difference of said fifth and third signals and to said first capacitance, wherein said measure of proximity is further responsive to said first factor.

12. A method of sensing the proximity of an electric-field-influencing media within a region of space as recited in claim 11, wherein said first phase is substantially out-of-phase with said first oscillatory signal and said second phase is substantially in-phase with said first oscillatory signal.

13. A method of sensing the proximity of an electric-field-influencing media within a region of space as recited in claim 12, wherein said fifth signal is measured when said second oscillatory signal has said first phase relative to said first oscillatory signal.

14. A method of sensing the proximity of an electric-field-influencing media within a region of space as recited in claim 13, further comprising operatively connecting a second capacitance to said first electrode when said second oscillatory signal has said second phase relative to said first oscillatory signal, wherein said fourth signal is further responsive to said second capacitance and said measure of proximity is further responsive to said second capacitance.

15. A method of sensing the proximity of an electric-field-influencing media within a region of space as recited in claim 12, further comprising operatively connecting a second capacitance to said first electrode when said second oscillatory signal has said second phase relative to said first oscillatory signal, wherein said fourth signal is further responsive to said second capacitance and said measure of proximity is further responsive to said second capacitance.

16. A method of sensing the proximity of an electric-field-influencing media within a region of space as recited in claim 11, wherein said third signal is a third voltage, said fourth signal is a fourth voltage, said fifth signal is a fifth voltage, said first factor comprises a sensitivity factor in units of volts/capacitance, and said measure of proximity comprises said first difference divided by said first factor.

17. A method of sensing the proximity of an electric-field-influencing media within a region of space as recited in claim 11, further comprising operatively connecting a second capacitance to said first electrode when said second oscillatory signal has said second phase relative to said first oscillatory signal, wherein said fourth signal is further responsive to said second capacitance and said measure of proximity is further responsive to said second capacitance.

18. A method of sensing the proximity of an electric-field-influencing media within a region of space as recited in claim 9, further comprising operatively connecting a second capacitance to said first electrode when said second oscillatory signal has said second phase relative to said first oscillatory signal, wherein said fourth signal is further responsive to said second capacitance and said measure of proximity is further responsive to said second capacitance.

19. A method of sensing the proximity of an electric-field-influencing media within a region of space as recited in claim 9, further comprising comparing said measure of proximity with a first threshold and disabling a restraint actuator if said measure of proximity is less than a threshold.

20. A method of sensing the proximity of an electric-field-influencing media within a region of space as recited in claim 9, further comprising calculating an offset as an average of said measure of proximity.

21. A method of sensing the proximity of an electric-field-influencing media within a region of space as recited in claim 20, wherein said average incorporates only those measures of proximity that are both greater than said first threshold and less than a second threshold.

22. A method of sensing the proximity of an electric-field-influencing media within a region of space as recited in claim 20, further comprising:
   a. generating a third difference of said offset and said measure of proximity;
   b. comparing said third difference with a third threshold; and
   c. disabling a restraint actuator if said third difference is greater than said third threshold.

23. A method of sensing the proximity of an electric-field-influencing media within a region of space as recited in claim 20, further comprising comparing said measure of proximity with a fourth threshold, and if said measure exceeds said fourth threshold, updating said offset if a measure responsive to a change in said third signal exceeds a measure responsive to a change in said fourth signal.

24. A method of sensing the proximity of an electric-field-influencing media within a region of space as recited in claim 9, further comprising locating at least one third electrode at least partially between said first electrode and said at least one second electrode and applying a fifth oscillatory signal to at least one third electrode, wherein said at least one fifth oscillatory signal is substantially in-phase with said at least one first oscillatory signal.

25. A method of sensing the proximity of an electric-field-influencing media within a region of space as recited in claim 9, further comprising comparing said measure of proximity with a fourth threshold and if said measure exceeds said fourth threshold, disabling a restraint actuator if a measure responsive to a change in said fourth signal over time exceeds a fifth threshold.

26. A method of operatively coupling adding capacitance to an input of an operational amplifier, comprising:
   a. operatively coupling a first terminal of a first switch to a first terminal of a second switch at a second node;
   b. operatively coupling a first terminal of a capacitor to said second node;
   c. operatively coupling a second terminal of said second switch to a first input of an operational amplifier;
   d. operatively coupling one of a second terminal of said capacitor and a second terminal of said first switch to a second input of said operational amplifier;
   whereby said operational amplifier acts to substantially null a potential difference between said first and second inputs, and
   e. operatively coupling the other of said second terminal of said capacitor and said second terminal of said first switch to a circuit ground, wherein said capacitor has a capacitance between said first and second terminals of said capacitor, wherein when said first switch is closed and said second switch is open, said capacitance is added to said second input of said operational amplifier, and when said first switch is open and said second switch is closed, said capacitance is not added to said second input of said operational amplifier.

27. A method of operatively coupling adding capacitance to an input of an operational amplifier as recited in claim 26, wherein said first and second switches comprise field effect transistors.

28. A method of operatively coupling adding capacitance to an input of an operational amplifier as recited in claim 26, wherein said second terminal of said capacitor is operatively coupled to said second input of said operational amplifier and said second terminal of said first switch is operatively coupled to said circuit ground.

29. A method of operatively coupling adding capacitance to an input of an operational amplifier as recited in claim 26, wherein said second terminal of said first switch is operatively coupled to said second input of said operational amplifier and said second terminal of said capacitor is operatively coupled to said circuit ground.

\* \* \* \* \*

UNITED STATES PATENT AND TRADEMARK OFFICE
CERTIFICATE OF CORRECTION

PATENT NO. : 6,445,294 B1
DATED : September 3, 2002
INVENTOR(S) : Judson G. McDonnell et al.

It is certified that error appears in the above-identified patent and that said Letters Patent is hereby corrected as shown below:

Column 2,
Line 51, "as" should be changed to -- first --; and
Line 60, "fist" should be changed to -- first --.

Column 5,
Line 62, "= =" should be changed to -- = --.

Column 8,
Line 16, "In" should be changed to -- in --;
Lines 16-20, the body of the paragraph should not be indented; and
Line 66, "and" should be changed to -- an --.

Column 9,
Line 41, "be" should be deleted;
Line 54, "rounded" should be changed to -- grounded --; and
Line 59, "deceases" should be changed to -- decreases --.

Column 10,
Line 59, the first occurrence of "+" should be changed to -- · --.

Column 11,
Line 40, "$10^{14}$" should be changed to -- $10^{-14}$ --;
Line 40, a new paragraph should be inserted before "$R_1$"; and
Line 40, -- x10 -- should be inserted after "6.28".

UNITED STATES PATENT AND TRADEMARK OFFICE
CERTIFICATE OF CORRECTION

PATENT NO. : 6,445,294 B1
DATED : September 3, 2002
INVENTOR(S) : Judson G. McDonnell et al.

It is certified that error appears in the above-identified patent and that said Letters Patent is hereby corrected as shown below:

Column 15,
Line 37 "adding" should be deleted.

Column 16,
Lines 21, 25 and 31, "adding" should be deleted.

Signed and Sealed this

Twenty-eighth Day of December, 2004

JON W. DUDAS
*Director of the United States Patent and Trademark Office*